United States Patent [19]

Miyatake

[11] Patent Number: 5,468,337
[45] Date of Patent: Nov. 21, 1995

[54] METHOD OF MENDING A DEFECT IN A PHASE SHIFT PATTERN

[75] Inventor: Hiroshi Miyatake, Itami, Japan

[73] Assignee: Mitsubishi Denki Kabushiki Kaisha, Tokyo, Japan

[21] Appl. No.: 43,523

[22] Filed: Apr. 6, 1993

[30] Foreign Application Priority Data

Jun. 2, 1992 [JP] Japan ..................................... 4-141248

[51] Int. Cl.$^6$ ...................................................... B44C 1/22
[52] U.S. Cl. .................................... 216/24; 430/5; 378/35
[58] Field of Search ..................................... 156/629, 630; 430/5; 378/35

[56] References Cited

FOREIGN PATENT DOCUMENTS

| | | |
|---|---|---|
| 0477035 | 3/1992 | European Pat. Off. . |
| 0050844 | 2/1992 | Japan . |
| 5-29200 | 2/1993 | Japan . |

Primary Examiner—R. Bruce Breneman
Attorney, Agent, or Firm—Oblon, Spivak, McClelland, Maier & Neustadt

[57] ABSTRACT

A method to mend a black defect and a white defect of a phase shift mask pattern so that the mended phase shift mask pattern has an accurately defined pattern. In the vicinity of a black defect and the area around the same, a mending phase shifter is formed into a thickness twice as large as the thickness d of a phase shifter. All light beams through a black defect area are nearly 0 degree out of phase with a non-phase-shifted light beam, thereby the phase shift mask pattern having the black defect becoming a phase shift mask pattern with an accurately defined pattern. In a similar manner, every light beam through a white defect area is nearly 180 degree out of phase with a non-phase-shifted light beam. As a result, a mended phase shift mask pattern has an accurately defined pattern.

13 Claims, 16 Drawing Sheets

METHOD OF MENDING A DEFECT IN A PHASE SHIFT PATTERN

BACKGROUND OF THE INVENTION

1. Field of the Invention

The present invention relates to a method of mending a black defect and a white defect in a mask having a phase shift mask pattern.

2. Description of the Prior Art

FIG. 1 is a cross sectional view showing the structure of a phase shift mask pattern of an on-the-phase-shifter type in which a light shielding pattern is disposed on a phase shifter. In FIG. 1, a phase shifter 2 is formed on a mask substrate 1, and a light shielding pattern 3 is disposed on the phase shifter 2. The light shielding pattern 3 is made of metal such as Cr and MoSi or metal alloy. The phase shifter 2 is provided under every other aperture 20 of the light shielding pattern 3. Since the phase shifter 2 shifts the phase of a light by 180 degrees, an alternation of non-phase-shifted light and phase-reversed light results below the apertures 20.

FIG. 2 is a cross sectional view showing the structure of a phase shift mask pattern of an below-the-phase-shifter type in which a light shielding pattern is located under a phase shifter. In FIG. 2, a patterned light shielding film 3 is disposed on a mask substrate 1, and a phase shifter 2 is formed so as to cover every other aperture 21 of the light shielding film 3. The below-the-phase-shifter type phase shift mask shares the same feature with the on-the-phase-shifter type phase shift mask-that light beams through every other aperture 21 have reversed phases.

FIG. 3 is a cross sectional view showing black defect (area) and a white defect (area) as they are found in a phase shift mask of the on-the-phase-shifter type. As shown in FIG. 3, if the phase shifter 2 is found where it is not supposed to be found, that phase shifter 2 is a black defect (area) 4. On the contrary, if the phase shifter 2 is partially lacking and hence is not found where it is supposed to be found, the lacking portion of the phase shifter 2 is a white defect (area) 7.

FIG. 4 is a cross sectional view showing a black defect (area) and a white defect (area) as they are found, in a phase shift mask of the below-the-phase-shifter type. As in a phase shifter of the on-the-phase-shifter type, the phase shifter 2 which is found where it is not supposed to be found is a black defect 4, and the phase shifter 2 which is partially lacked where it is supposed not to be found as such is a white defect 7.

FIGS. 5 and 6 are cross sectional views showing how to correct a black defect an on-the-phase-shifter type mask having a conventional phase shift mask pattern. The black defect 4 as that shown in FIG. 5 is etched away by local irradiation of an ion beam 22 which is applied to an area containing the black defect 4 as shown in FIG. 6. The ion beam 22 is irradiated from a focusing ion beam (FIB) apparatus which is not shown in the drawing. A black defect of a phase shift mask of the on-the-phase-shifter type is mended in the same fashion.

This mending method, however, inherently produces on the surface of the mask substrate 1 an etching defect 11 which has a similar profile to that of the black defect 4. A light beam through the etching defect 11 has a disordered phase, which must be avoided if high resolution optical lithography is desired. Thus, accurate correction of a pattern defect of a phase shift mask is not attainable with the conventional mending method.

As to a white defect, there is no effective mending method available.

SUMMARY OF THE INVENTION

The present invention relates to a method of mending a black defect area in a mask which has a phase shifter formed on a mask substrate in the shape of a predetermined pattern, the black defect area being made of the phase shifter and located in the phase shift pattern where it is not supposed to be. The method is characterized in that a mending phase shifter is formed on an around-black-defect area which includes the black defect area to a thickness large enough to eliminate the adverse optical effect of the black defect area, the mending phase shifter being made of material which has the same refractive index as that of the phase shifter.

The phase shifter is preferably 1.5 to 2.5 times as thick from a surface of the mask substrate as the phase shifter.

Another aspect of the present invention relates to a method of mending a black defect area in a mask which has a phase shift pattern which is comprised of a phase shifter of a predetermined pattern formed on a mask substrate and a light shielding film of a predetermined pattern formed on the phase shifter, the black defect area being made of the phase shifter and located in a surface of the mask substrate where it is not supposed to be. The method comprises: a first step of forming a mending phase shifter entirely on the mask substrate and setting the thickness of the mending phase shifter from the surface of the mask substrate as 1.5 to 2.5 times as thick as the phase shifter, the mending phase shifter being made of material which has the same refractive index as that of the phase shifter; a second step of forming a resist on the mending phase shifter at an area which corresponds to the black defect area; and a third step of etching the mending phase shifter through the resist.

The phase shifter is preferably made of an oxide silicon film and the mending phase shifter is preferably made of SOG.

The mending phase shifter may be made of oxide silicon.

The first step preferably includes the steps of: forming an oxide silicon film which has the same refractive index as that of the phase shifter entirely on the on the mask substrate in such a manner that the oxide silicon film is 2.5 or more times as thick from the surface of the mask substrate as the phase shifter and has a flat surface; and etching the oxide silicon film from above so that a resultant oxide silicon film, which is a mending phase shifter, has a thickness 1.5 to 2.5 times as thick as the phase shifter.

The method may further comprise the step of, before the first step, forming a thin film entirely on the mask substrate on which the phase shifter and the light shielding pattern are disposed, the thin film being etching-resistant so that it is not etched away during the etching of the third step.

Alternatively, the mask substrate may be entirely covered with a thin film which is not etched away by the etching of the third step so that a light beam through the thin film and the phase shifter is 180 degrees out of phase with a non-phase-shifted light beam.

Still another aspect of the present invention relates to a method of mending a black defect area in a mask which has a phase shift pattern which is comprised of a light shielding film of a predetermined pattern formed on a mask substrate and a phase shifter of a predetermined pattern formed on uncovered surface of the mask substrate, the black defect area being made of the phase shifter and located in a surface of the mask substrate where it is not supposed to be. The method comprises: a first step of forming a mending phase shifter entirely on the on the mask substrate which is made of material in such a manner that the mending phase shifter is 1.5 to 2.5 times as thick from a surface of the mask substrate as the phase shifter, the mending phase shifter being made of material which has the same refractive index as that of the phase shifter and has a flat surface; a second step of forming a resist on the mending phase shifter at an area which corresponds to the black defect area; and a third step of etching the mending phase shifter through the resist. The present invention also relates to a method of mending a white defect area in a mask which has a phase shifter formed on a mask substrate in the shape of a predetermined pattern, the white defect area being defined as a partially lacked portion of the phase shifter. The method is characterized in that a mending phase shifter is formed on an around-white-defect area which includes the white defect area to a thickness enough large to eliminate adverse optical effect of the white defect, the mending phase shifter being made of material which has the same refractive index as that of the phase shifter.

The mending phase shifter is preferably 1.5 to 2.5 times as thick from a surface of the phase shifter including the white defect as the phase shifter.

Another aspect of the invention relates to a method of mending a white defect area in a mask which has a phase shift pattern which is comprised of a phase shifter of a predetermined pattern formed on a mask substrate and a light shielding film of a predetermined pattern formed on the phase shifter, the white defect area being defined as a partially lacked portion of the phase shifter. The method comprises: a first step of forming a mending phase shifter entirely on the mask substrate and setting the thickness of the mending phase shifter from the surface of the mask substrate as 2.5 to 3.5 times as thick as the phase shifter, the mending phase shifter being made of material which has the same refractive index as that of the phase shifter; a second step of forming a resist on the mending phase shifter at an area which corresponds to the white defect area; and a third step of etching the mending phase shifter through the resist.

Still other aspect of the present invention relates to a method of mending a white defect area in a mask which has a phase shift pattern which is comprised of a light shielding film of a predetermined pattern formed on a mask substrate and a phase shifter of a predetermined pattern formed on an uncovered surface of the mask substrate, the white defect area being defined as a partially lacked portion of the phase shifter. The method comprises: a first step of forming a mending phase shifter entirely on the mask substrate and setting the thickness of the mending phase shifter from the surface of the mask substrate as 2.5 to 3.5 times as thick as the phase shifter, the mending phase shifter being made of material which has the same refractive index as that of the phase shifter; a second step of forming a resist on the mending phase shifter at an area which corresponds to the white defect area; and a third step of etching the mending phase shifter through the resist.

Thus, the method of mending a black defect requires that the mending phase shifter, which is made of material which has the same refractive index as that of the phase shifter, is formed on the around-black-defect area enough thick to remove adverse optical effect of the black defect. For instance, the mending phase shifter is 1.5 to 2.5 times as thick from the surface of the mask substrate as the phase shifter.

As a result, a light beam through the around-black-defect area is delayed by 0±90 degrees. That is, a light beam through the around-black-defect area is almost equivalent to a light beam through an area without the black defect which arrives 90 degree out of phase with a non-phase-shifted light beam. Hence, the method claims no damage of the around-black-defect area, allowing that the mended phase shift mask pattern has an accurately defined pattern.

The method of mending a white defect requires that the mending phase shifter, which is made of material which has the same refractive index as that of the phase shifter, is formed on the around-white-defect area enough thick to remove adverse optical effect of the white defect. For example, the mending phase shifter is 1.5 to 2.5 times as thick from the surface of the phase shifter including the white defect as the phase shifter.

This causes a light beam through the around-white-defect area to be shifted by $\alpha \pm 90$ degrees. In other words, a light beam through the around-white-defect area is almost equivalent to a light beam through an area without the white defect which arrives $\alpha$ degree out of phase with a non-phase-shifted light beam. Hence, the method produces no damage of the around-white-defect area, which in turn allows that the mended phase shift mask pattern has an accurately defined pattern.

Accordingly, it is an object of the present invention to offer a defect mending method with which a defective phase shift mask pattern including a black defect and/or a white defect is mended so that a phase shift mask having an accurate pattern is obtainable.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 11 to 15 are cross sectional views showing a method of mending a white defect of a phase shift pattern of a second preferred embodiment of the present invention;

DESCRIPTION OF THE PREFERRED EMBODIMENTS

FIGS. 7 to 10 are cross sectional views showing a mending method of a black defect in a mask having a phase shift, mask pattern of the on-the-phase-shifter type according to a first preferred embodiment of the present invention.

Figure 1:
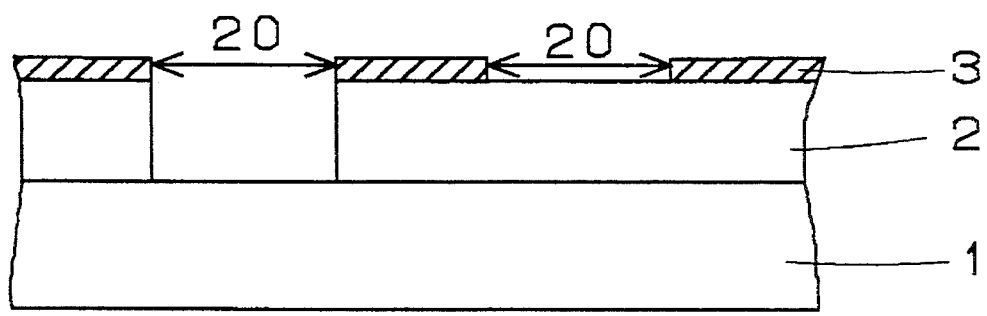
FIG. 1 is a cross sectional view of a phase shift pattern of the on-the-phase-shifter type.
Figure 2:
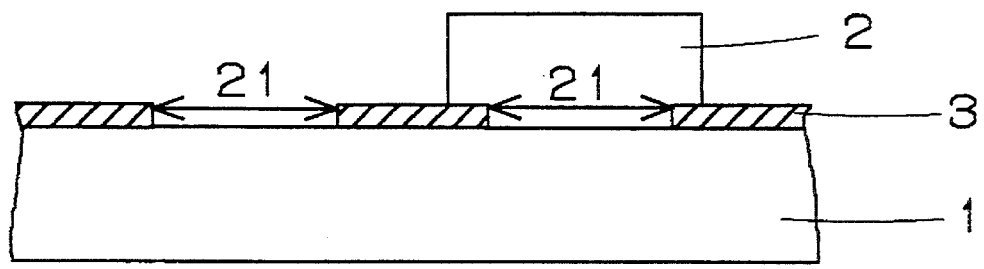
FIG. 2 is a cross sectional view of a phase shift pattern of the below-the-phase-shifter type.
Figure 3:
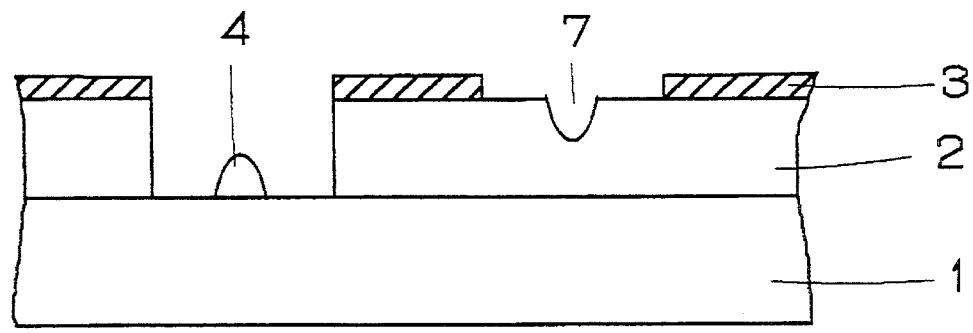
FIG. 3 is a cross sectional view of a black and a white defects which are found in a phase shift pattern of the on-the-phase-shifter type.
Figure 4:
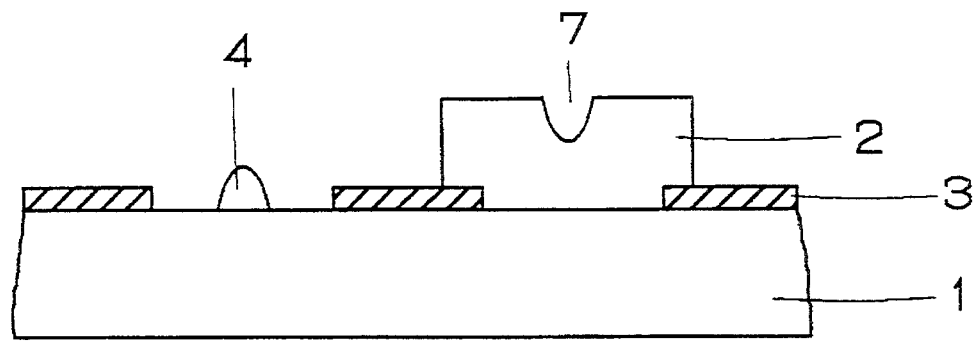
FIG. 4 is a cross sectional view of a black and a white defects which are found in a phase shift pattern of the below-the-phase-shifter type.
Figure 5:
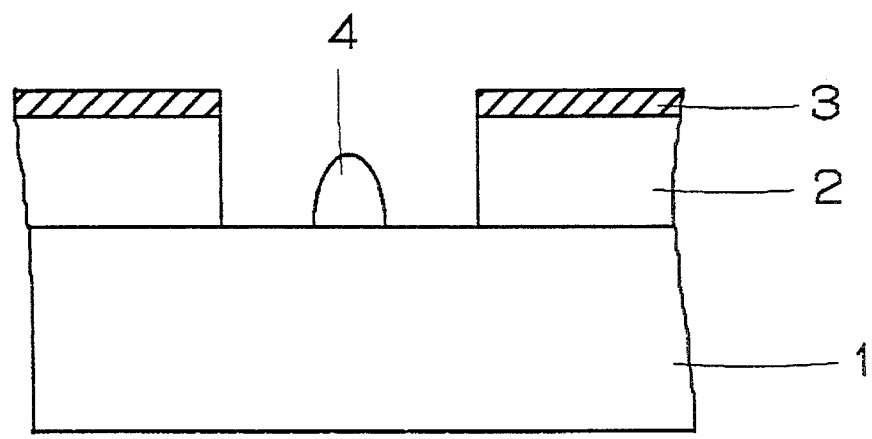
FIGS. 5 and 6 are cross sectional views showing a conventional method of mending a black defect of a phase shift pattern.
Figure 6:
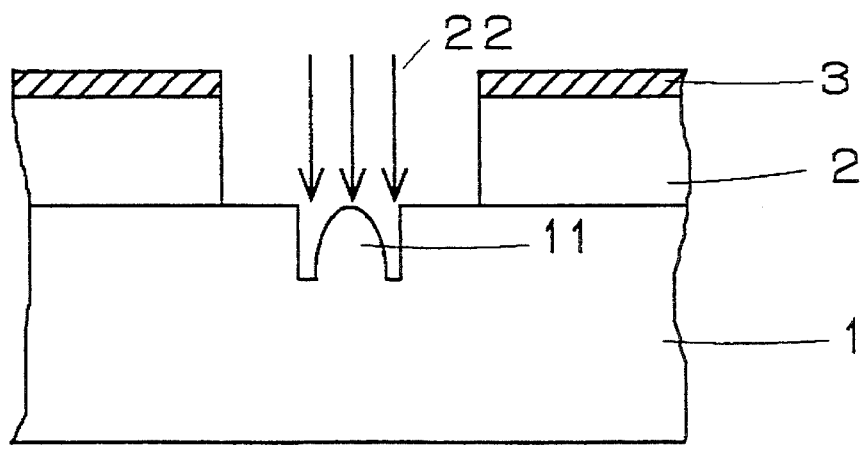
Figure 7:
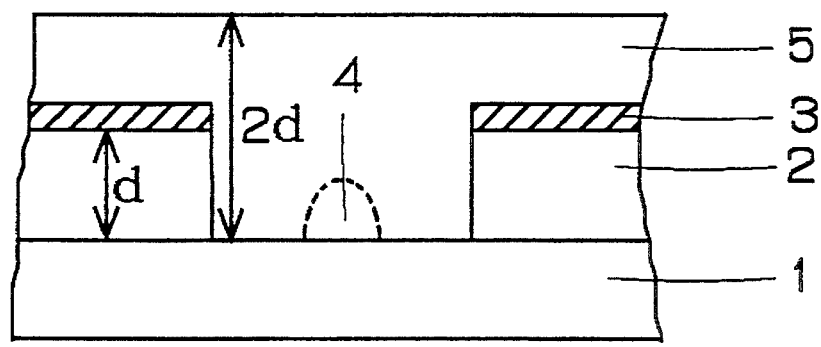
FIGS. 7 to 11 are cross sectional views showing a method of mending a black defect of a phase shift pattern of a first preferred embodiment of the present invention.

Likewise the phase shift mask of FIG. 5, a patterned phase shifter 2 and a patterned light shielding pattern 3 are formed on a mask substrate 1 which is made of quartz. A black defect (area) 4 which is made of the same material as the phase shifter 2 is on the mask substrate 1 at a position where the phase shifter 2 must not be found. This is also similar to the phase shift mask of FIG. 5.

The material of the phase shifter 2 is, like an oxide silicon film, translucent to a light beam from an exposure light source for optical lithography, which is also what the mask substrate 1 is. The light shielding film 3 is made of metal such as Cr and MoSi or metal alloy.

If the phase shift mask pattern includes such a black defect, correction of the black defect involves to apply SOG (Spin On Glass) having the same refractive index as that of the phase shifter 2 to the phase shift mask pattern to thereby form a mending phase shifter 5. Due to its nature, SOG accumulates pretty flat even on the black defect 4 and the area around the same.

The mending phase shifter 5 is formed so as to be twice as thick from the surface of the mask substrate 1 as the thickness d of the phase shifter 2. That is, it is required that the mending phase shifter 5 has, on the light shielding pattern 3, a thickness which is defined as {(the thickness of the phase shifter 2)–(the thickness of the light shielding pattern 3)}.

Figure 8:
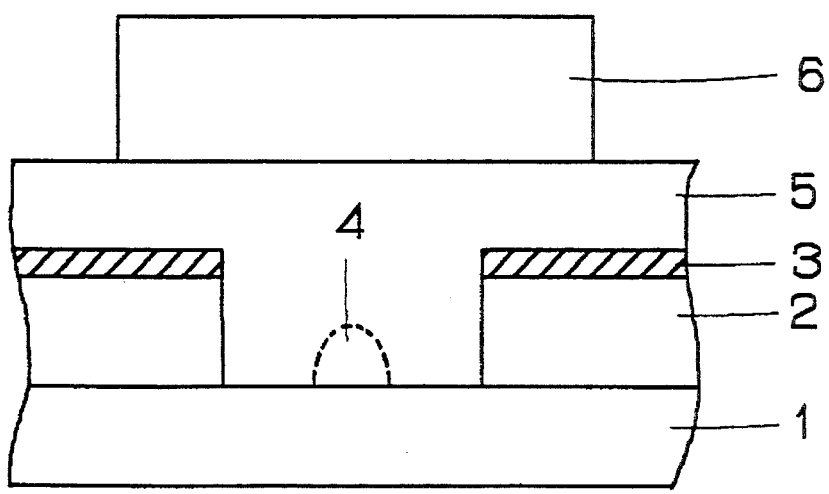
Figure 9:
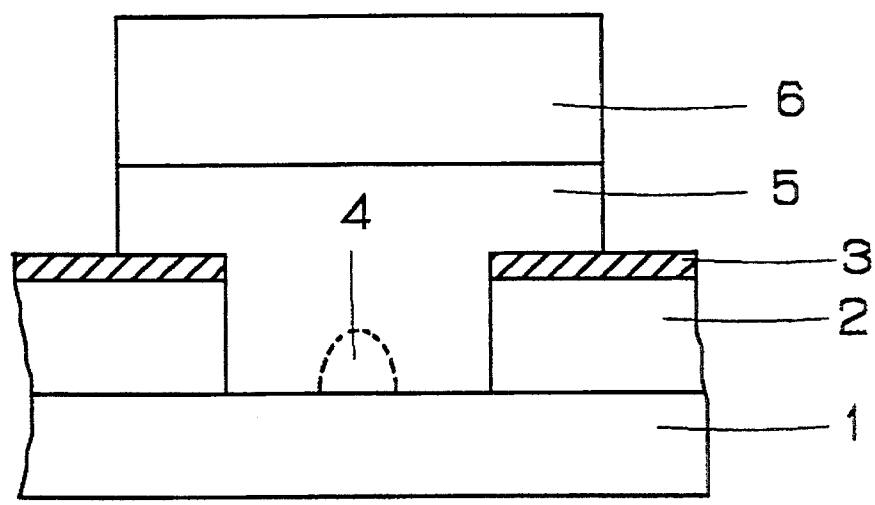

Next, as shown in FIG. 8, a resist 6 is deposited on the mending phase shifter 5 and patterned so that the resist 6 remains only at a region which completely covers the black defect 4. The mending phase shifter 5 is then etched using the resist 6 as a mask as shown in FIG. 9, which is followed by removal of the resist 6 (FIG. 10).

Figure 10:
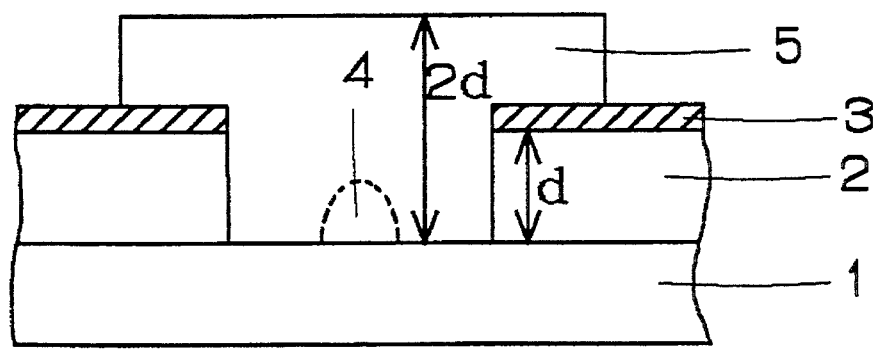

Thus, the mending method of the first preferred embodiment demands that the mending phase shifter 5 is twice as thick in the vicinity of the black defect 4 as the thickness d of the phase shifter 2 as shown in FIG. 10. In the meantime, the thickness d of the phase shifter 2 is determined so as to cause a light beam through the same becomes 180 degrees out of phase with a non-phase-shifted light beam. Hence, a light beam through the mending phase shifter 5 is 360 degrees out of phase with a non-phase-shifted light beam since the mending phase shifter 5 has a thickness 2d near the black defect 4. In addition, since the black defect 4 and the phase shifter 2 are made of the same material and the black defect 4 and the mending phase shifter 5 have the same refractive index, a light beam through both the black defect 4 and the mending phase shifter 5 arrives 360 degrees out of phase with a non-phase-shifted light beam. In other words, a light beam through the black defect 4 and the area around the same is equivalent to a light beam through an area without the black defect 4 (which arrives 0 degree out of phase with a non-shifted light beam) in terms of a phase difference from that of a non-phase-shifted light beam, thereby totally eliminating a phase difference due to the black defect 4.

Thus, claiming no surface damage of the mask substrate 1, the method of mending a black defect of a phase shift mask pattern according to the first preferred embodiment realizes accurate correction of a defect.

FIGS. 11 to 15 are cross sectional views showing a mending method of a white defect of a mask having a phase shift mask pattern of the on-the-phase-shifter type (second preferred embodiment of the present invention).

Figure 11:
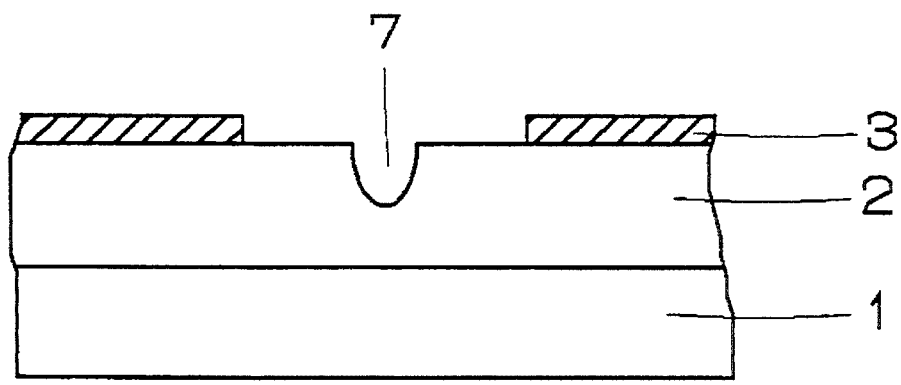

As shown in FIG. 11, a patterned phase shifter 2 and a patterned light shielding pattern 3 are formed on a mask substrate 1 which is made of quartz, and the phase shifter 2 is partially removed which is identified as a white defect (area) 7.

Figure 12:
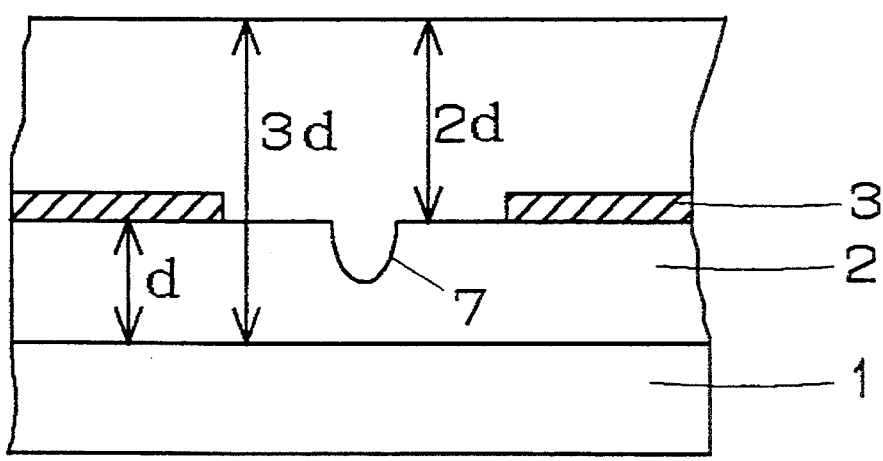

A first step of mending such a white defect in the phase shift mask pattern is to apply SOG which has the same refractive index as that of the phase shifter 2 to the phase shift mask pattern to thereby form a mending phase shifter 8 (FIG. 12). Due to its nature, SOG accumulates quite flat even on the white defect 7 and the area around the same.

The mending phase shifter 8 must be three times as thick from the surface of the mask substrate 1 as the phase shifter 2. That is, the mending phase shifter 8 needs to have, on the light shielding pattern 3, a thickness which is defined as {2×(the thickness of the phase shifter 2)–(the thickness of the light shielding pattern 3)}.

Figure 13:
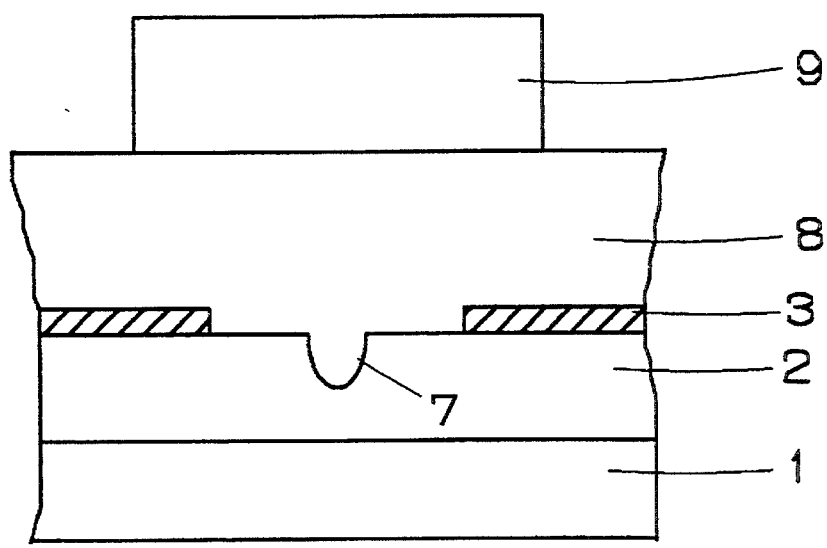
Figure 14:
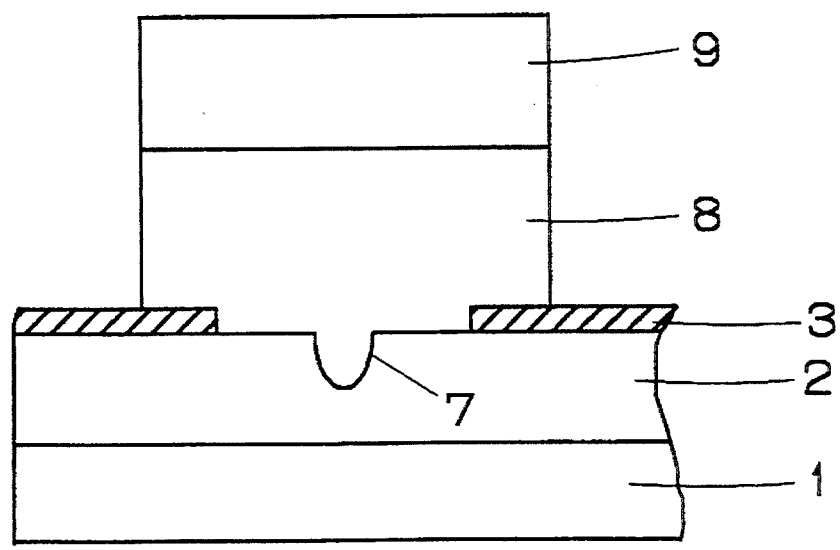
Figure 15:
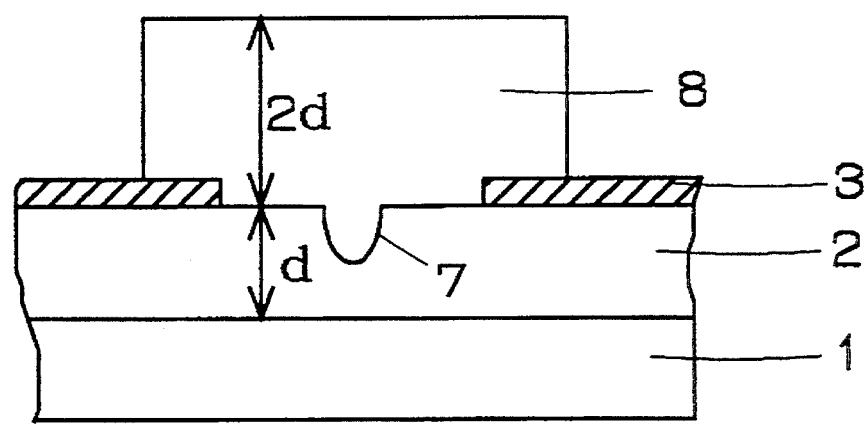

Following this, a resist 9 is deposited on the mending phase shifter 8 and patterned so that the resist 9 remains only at a region which completely covers the white defect 7 as shown in FIG. 13. The mending phase shifter 8 is thereafter etched through the resist 9 as shown in FIG. 14. The resist 9 is then removed (FIG. 15).

As described immediately above, in the method of mending a white defect of a phase shift mask pattern according to the second preferred embodiment, the mending phase shifter 8 is twice as thick in the vicinity of the white defect 7 as the thickness d of the phase shifter 2. In the meantime, the thickness d of the phase shifter 2 is determined so that a light beam through the phase shifter 2 is 180 degrees out of phase with a non-phase-shifted light beam. Hence, in the vicinity of the white defect 7, a light beam through both the mending phase shifter 8 and the phase shifter 2 is 180 (540) degrees out of phase with a non-phase-shifted light beam. Thus, a light beam through the white defect 7 and the area around the same is equivalent to a light beam through an area without the white defect 7 (which arrives 180 degree out of phase with a non-shifted light beam) in terms of a phase difference from that of a non-phase-shifted light beam, thereby a phase difference due to the white defect. 7 being totally eliminated.

Thus, mending the method of the second preferred embodiment makes it possible that a white defect of a phase shift mask pattern is accurately corrected.

FIGS. 16 to 20 are cross sectional views showing a mending method of a black defect in a mask having a phase shift mask pattern of the below-the-phase-shifter type (third preferred embodiment of the present invention).

Figure 16:
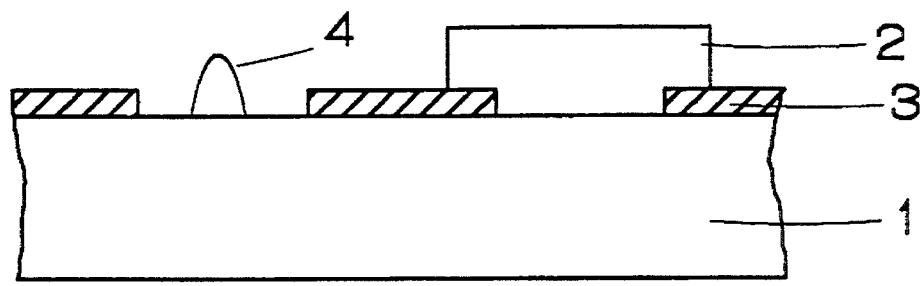
FIGS. 16 to 20 are cross sectional views showing a method of mending a black defect of a phase shift pattern of a third preferred embodiment of the present invention.
Figure 17:
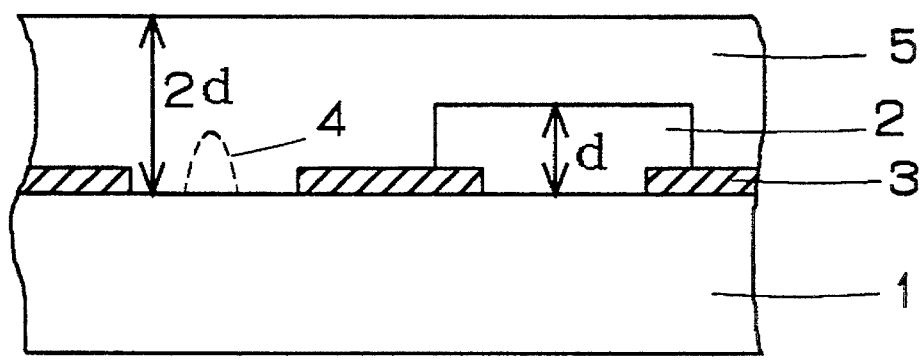

In FIG. 16, a patterned light shielding film 3 is disposed on a mask substrate 1 which is made of quartz. A phase shifter 2 is formed on every other surface space of the mask substrate 1 between the light shielding films 3. A black defect 4 which is made of the same material as that of the phase shifter 2 is on a surface space of the mask substrate 1 between the light shielding films 3 although it must not be there.

If a phase shift mask pattern includes a black defect as above, a first step to be taken is to apply SOG (Spin On Glass) having the same refractive index as that of the phase shifter 2 to the phase shift mask pattern to thereby form a mending phase shifter 5. Due to its nature, SOG accumulates pretty flat even on the black defect and the area around the same.

SOG needs to be applied so that the resultant mending phase shifter 5 is twice as thick from the surface of the mask substrate 1 as the phase shifter 2. More precisely, on the light shielding pattern 3, the thickness of the mending phase shifter 5 must be as that defined as {2 ×(the thickness of the phase shifter 2)–(the thickness of the light shielding pattern 3)}.

Figure 18:
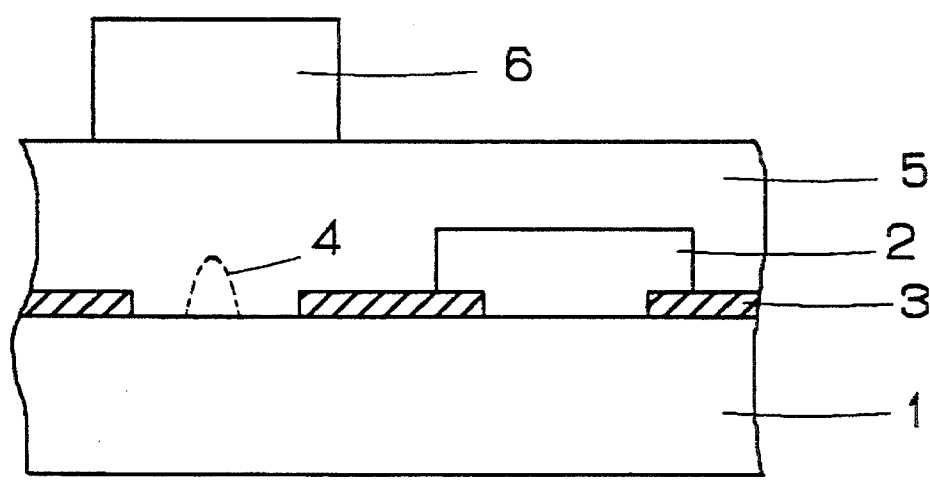
Figure 19:
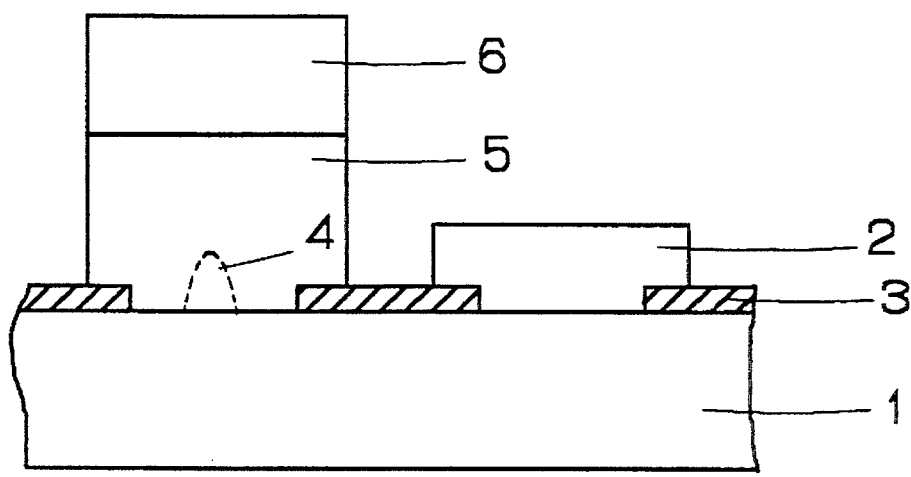
Figure 20:
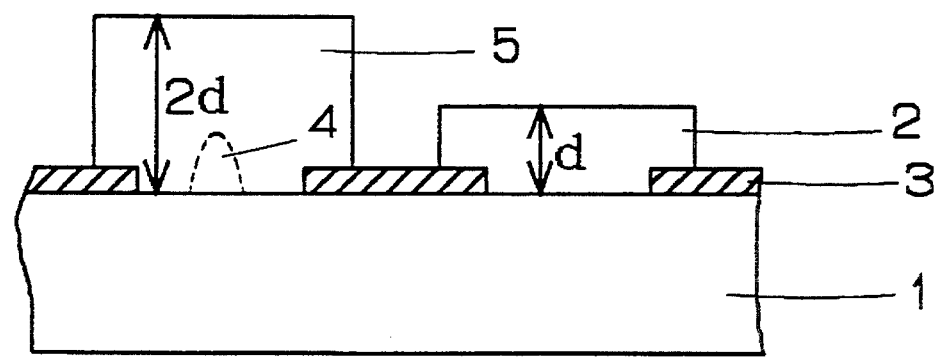

Next, a resist 6 is deposited on the mending phase shifter 5 and patterned so that the resist 6 is left unetched only at a region which completely covers the black defect 4 as shown in FIG. 18. The mending phase shifter 5 is then etched using the resist 6 as a mask as shown in FIG. 19, followed by removal of the resist 6 (FIG. 20).

Thus, in the mending method of the third preferred embodiment, the mending phase shifter 5 is twice as thick in the vicinity of the black defect 4 as the thickness d of the phase shifter 2. Since the thickness d of the phase shifter 2 is determined so as to cause a light beam through the phase shifter 2 becomes 180 degrees out of phase with a non-phase-shifted light beam, a light beam through the mending phase shifter 5 is 360 degrees (0 degree) out of phase with a non-phase-shifted light beam. In addition, since the black defect 4 and the phase shifter 2 are made of the same material, a light beam through both the black defect 4 and the mending phase shifter 5 is also 360 degrees out of phase with a non-phase-shifted light beam. In other words, a light beam through the black defect 4 and the area around the same is equivalent to a light beam through an area without the black defect 4 (which arrives 0 degree out of phase with a non-shifted light beam) in terms of a phase difference from that of a non-phase-shifted light beam. This completely eliminates a phase difference due to the black defect 4.

Thus, if processed by the mending method of the third preferred embodiment to mend a black defect of a phase shift mask pattern, the mask substrate 1 sees no chance of getting damaged. Hence, mending of the black defect of the phase shift mask pattern is accurate.

FIGS. 21 to 25 are cross sectional views showing a mending method of a white defect in a mask having a phase shift mask pattern of the below-the-phase-shifter type (fourth preferred embodiment of the present invention).

Figure 21:
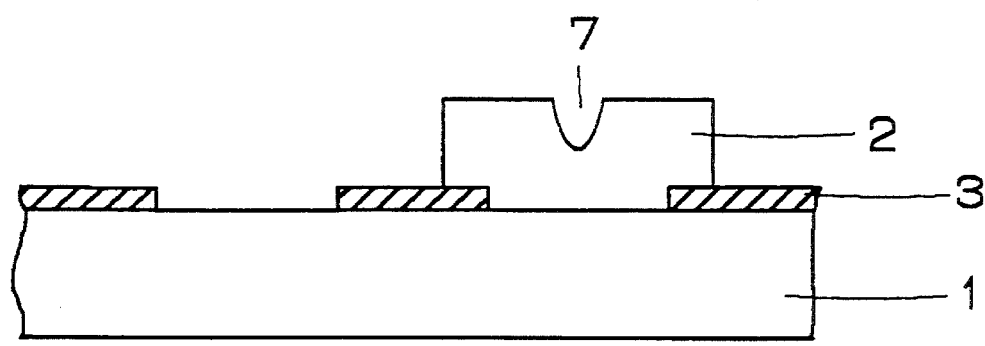
FIGS. 21 to 25 are cross sectional views showing a method of mending a white defect of a phase shift pattern of a fourth preferred embodiment of the present invention.
Figure 22:
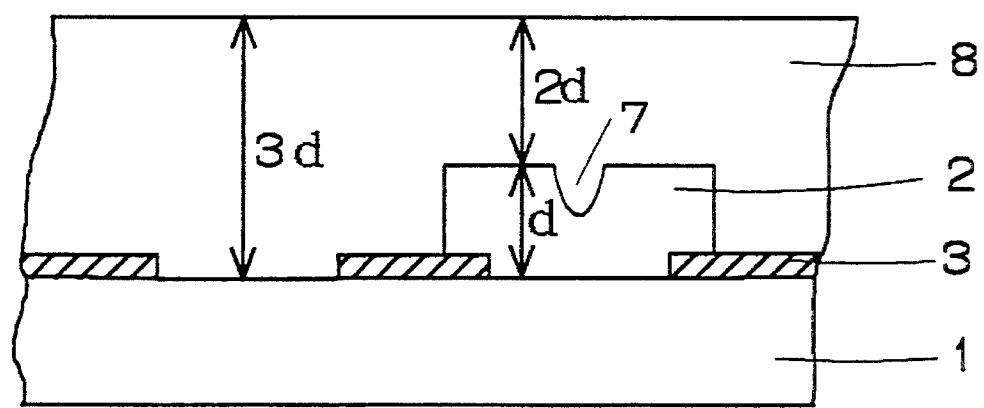

As shown in FIG. 21, a pattern light shielding film 3 is disposed on a mask substrate 1 which is made of quartz. A phase shifter 2 is formed on every other surface space of the mask substrate 1 between the light shielding films 3. The phase shifter 2 includes on the surface a white defect 7.

Mending of such a phase shift mask pattern including the white defect 7 requires that SOG having the same refractive index as that of the phase shifter 2 is applied to the phase shift mask pattern to thereby form a mending phase shifter 8. The accumulated SOG shows an excellent flatness even on the white defect 7 and the area around the same.

The mending phase shifter 8 must be three times as thick from the surface of the mask substrate 1 as the phase shifter 2. That is, on the light shielding pattern 3, the mending phase shifter 8 needs to have a thickness which is defined as {3×(the thickness of the phase shifter 2)– (the thickness of the light shielding pattern 3)}.

Figure 23:
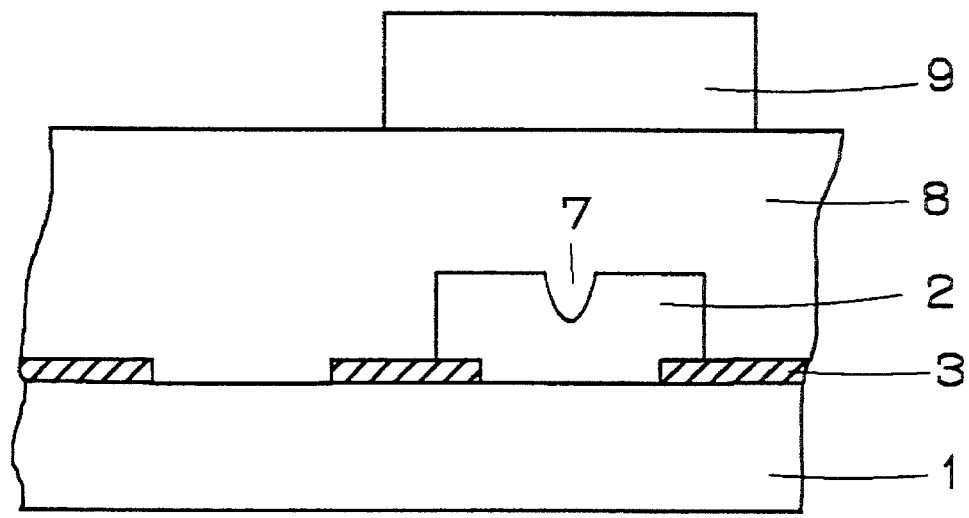
Figure 24:
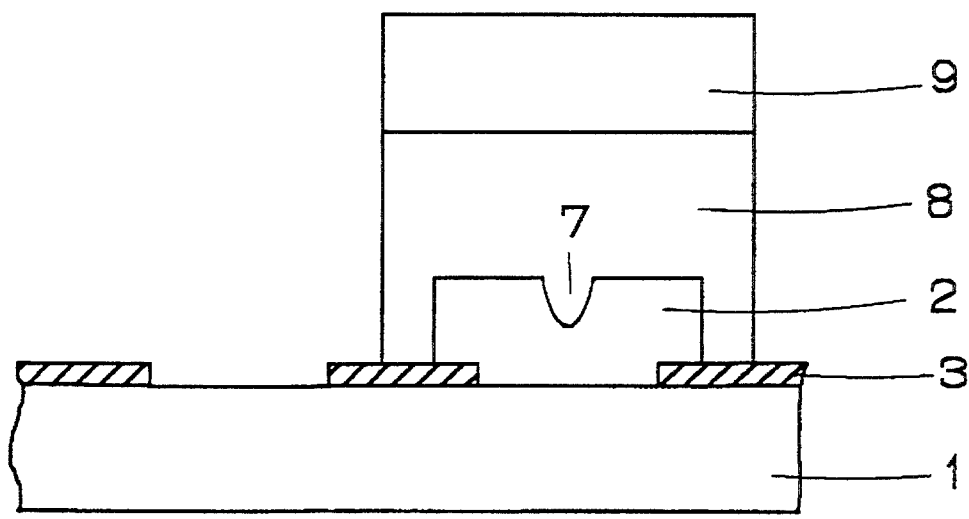
Figure 25:
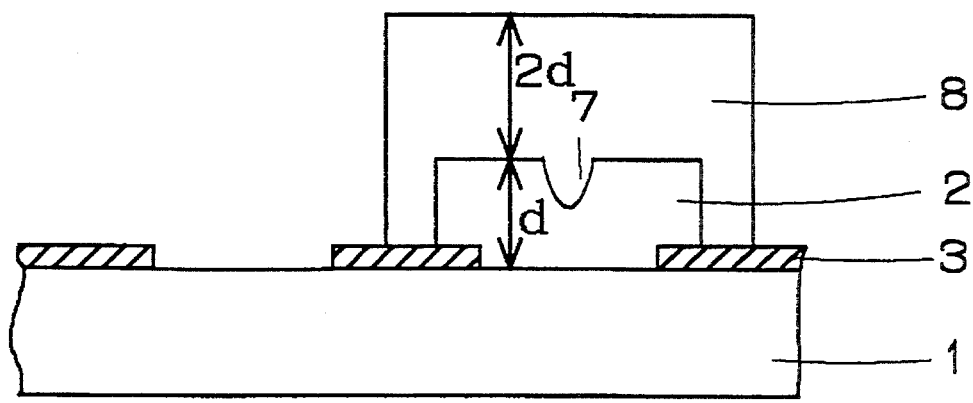

Following this, a resist 9 is deposited on the mending phase shifter 8 and patterned so that the resist 9 remains only at a region which completely covers the white defect 7 as shown in FIG. 23. The mending phase shifter 8 is thereafter etched through the resist 9 as shown in FIG. 24. The resist 9 is then removed (FIG. 25).

As described immediately above, in the method of mending a white defect of a phase shift mask pattern according to the fourth preferred embodiment, the mending phase shifter 8 is twice as thick in the vicinity of the white defect 7 as the thickness d of the phase shifter 2. Meanwhile, the thickness d of the phase shifter 2 is determined so that a light beam through the phase shifter 2 arrives 180 degrees out of phase with a non-phase-shifted light beam. Hence, in the vicinity of the white defect 7, a light beam through both the mending phase shifter 8 and the phase shifter 2 is 180(540) degrees out of phase with a non-phase-shifted light beam. Thus, a light beam through the white defect 7 and the area around the same is equivalent to a light beam through an area without the white defect 7 (which arrives 180 degree out of phase with a non-phase-shifted light beam) in terms of a phase difference from that of a non-phase-shifted light beam, thereby a phase difference due to the white defect 7 being utterly eliminated.

Thus, according to the mending method of the fourth preferred embodiment, it is possible to accurately mend a white defect of a phase shift mask pattern.

The foregoing regarding the first to the fourth preferred embodiments has described that the mending phase shifter is made of SOG. If SOG is used as such, the phase shift mask has a flat cross section even above a defect (either black or white) and the area around the same.

The mending phase shifter may be alternatively made of an oxide silicon film which is obtainable by the CVD method. In the following, description will be made on where the mending phase shifter is made of an oxide silicon film, while citing as an example the method of mending a black defect of a phase shift mask pattern according to the first preferred embodiment. Relevant drawings are shown in FIGS. 26 to 28.

Figure 26:
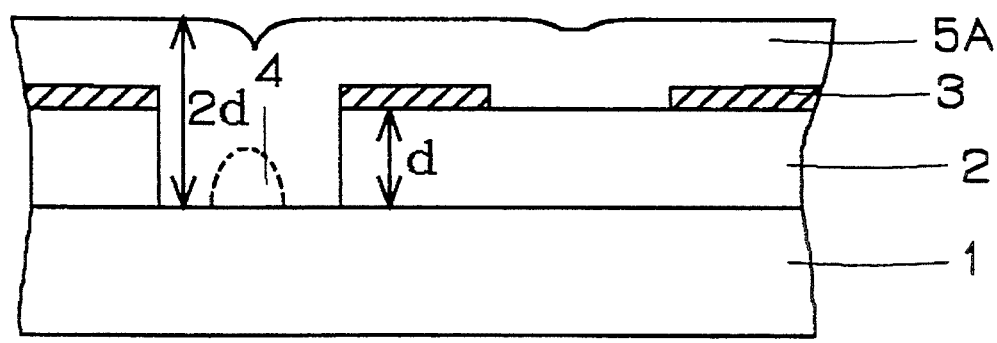
FIGS. 26 to 28 are cross sectional views showing other method of forming a mending phase mask.

An oxide silicon film 5A is grown on the light shielding film 3 into a thickness double as that of the thickness d of the phase shifter 2 from an area of the surface of the mask substrate 1 in which the black defect 4 exists (FIG. 26). The surface of the oxide silicon film 5A is not sufficiently flat.

Figure 27:
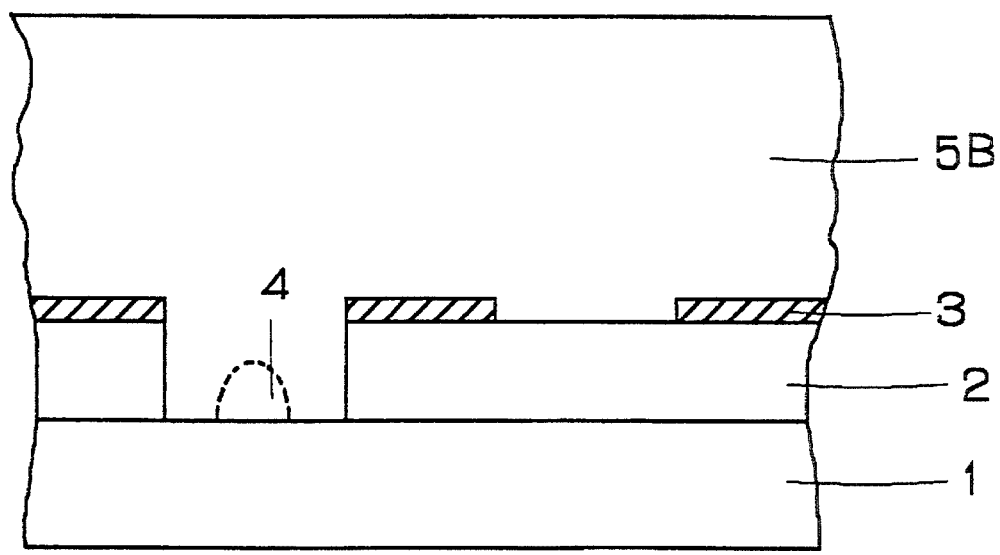
Figure 28:
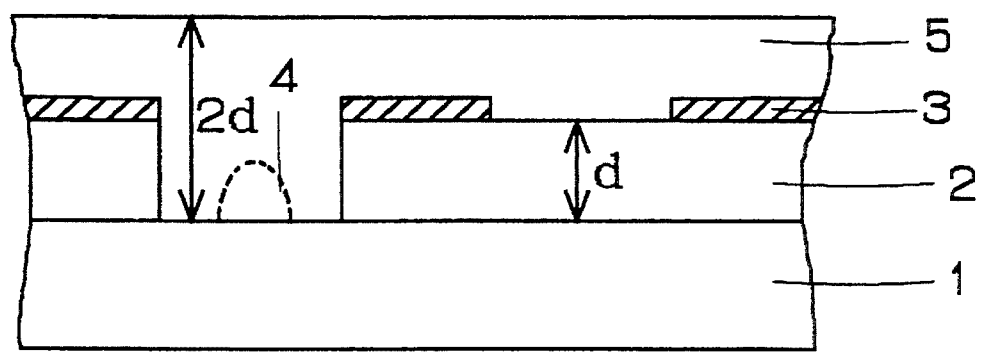

To remedy this, an oxide silicon film 5B is grown enough thick (>>2d) on the oxide silicon film 5a so that the oxide silicon film 5B has a flat surface as shown in FIG. 27. The entire surface of the oxide silicon film 5B is then etched (FIG. 28), thereby the mending phase shifter has a flat surface even above the black defect 4 and the area around the same. As a result, the mending phase shifter 5 is defined which has a thickness of precisely 2d on the mask substrate 1. The use of an oxide silicon film as the mending phase shifter in this manner is also applicable to the second to the fourth preferred embodiments.

The foregoing has also described that the phase shifter 2 and the mending phase shifter 5 (8) are made of materials which have the same refractive index. More precisely, features that the materials of these phase shifters must have is: to shift the phase of a lithography light beam; and to have equal or extremely close refractive indices.

To produce an 180-degree shifted light beam, the thickness Ts of the phase shifter needs to satisfy the relation $Ts = \lambda/2(n-1)$ where $\lambda$ is a wavelength of a light beam and n is a refractive index. Hence, to mend a black defect or a white defect, a mending phase shifter on an area near the black or the white defect preferably has a thickness as almost double that of the thickness d of the phase shifter 2 (i.e.,2d). In reality, however, the thickness of the mending phase shifter needs not to be precisely as such but instead may be in the range from 1.5d to 2.5d. It is experimentally proved that the mending phase shifter mends a black or a white defects even if the mending phase shifter has a thickness within that range. This in turn means that the thickness of the mending phase shifter needs to satisfy nothing but a relation (2id–0.5)~(2id +0.5) where i is a positive integer.

The mending methods of the first to the fourth preferred embodiments all require that the mending phase shifter is formed on a black or a white defects and the area around the same. These methods have a weakness that a non-defective surface of the phase shifter 2 might be etched altogether while etching the mending phase shifter 5 (8) through the resist 6 (9). In the third preferred embodiment, for example, during etching of the mending phase shifter 5 through the resist 6, the surface of the phase shifter 2 might be etched.

Figure 29:
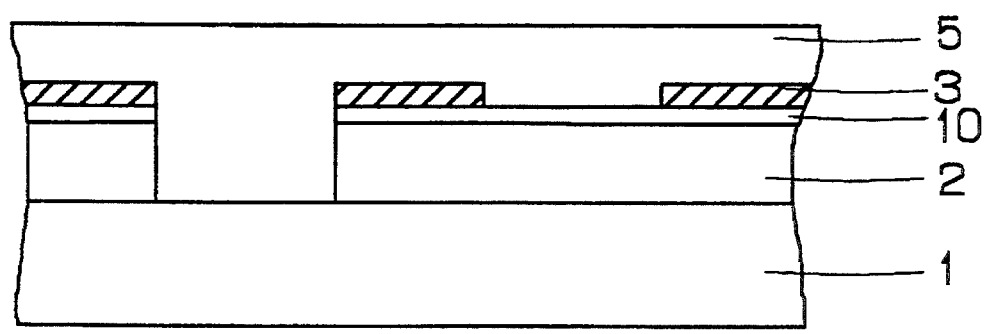
FIGS. 29 and 30 are cross sectional views showing applications of an etching stop thin film.

An etching stopper is one answer to the problem. For instance, in a phase shift mask of the on-the-phase-shifter type, an etching-resistant thin film 10 is formed on the phase shifter 2 as an etching stopper (FIG. 29). The mending phase shifter 5 is etched using a resist and the thin film 10 as well. It is more desirable if the thin film 10 entirely covers the mask substrate 1 on which the phase shifter 2 and the light shielding pattern 3 as shown in FIG. 30.

Figure 30:
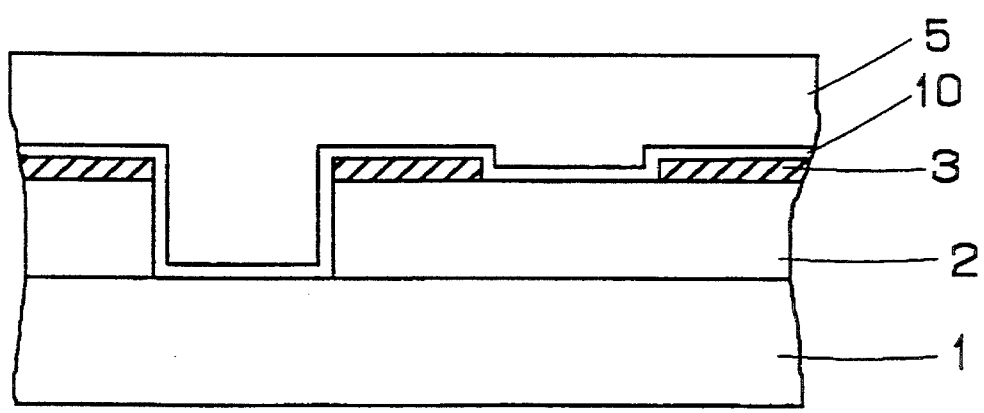

The structure of FIG. 30 will never invite deterioration in the optical function of the phase shifter 2 since the mask substrate 1 is entirely coated with the thin film 10. In the structure of FIG. 29, on the other hand, it must be ensured that a synthesized film realized by the phase shifter 2 and the thin film 10 shifts the phase of a light beam by 180 degrees. Although the examples shown in FIGS. 29 and 30 are phase shift masks of the on-the-phase-shifter type (the first and the second preferred embodiments), these approaches are applicable to phase shift masks of the below-the-phase-shifter type (the third and the fourth preferred embodiments).

If the phase shifter and the mending phase shifter are made of appropriately different materials, the unwanted etching of the phase shifter during etching of the mending phase shifter is prevented without using the etching stopper. It is also sufficient to locally deposit the mending phase shifter only in a region on which it needs to be formed and which is in the vicinity of a defect (either black or white).

While the invention has been described in detail, the foregoing description is in all aspects illustrative and not restrictive. It is understood that numerous other modifications and variations can be devised without departing from the scope of the invention.

I claim:

1. A method of mending a black defect area in a mask which has a phase shifter formed on a mask substrate in the shape of a pattern, said black defect area being made of said phase shifter and located in said phase shift pattern where it is not supposed to be, comprising the steps of: permanently forming a mending phase shifter on an around-black-defect which includes said black defect area to a thickness causing light passing therethrough to be phase shifted($\pm 10°$) by an integer multiple of 360° and eliminating an adverse optical effect of said black defect area, said mending phase shifter being made of material which has the same refractive index as that of said phase shifter.

2. The method of claim 1, wherein said mending phase shifter is 1.5 to 2.5 times as thick as said phase shifter.

3. A method of mending a black defect are in a mask which has a phase shift pattern which is comprised of a phase shifter of a first pattern formed on a mask substrate and a light shielding film of a second pattern formed on said phase shifter, said black area defect being made of said phase shifter and located in a surface of said mask substrate where it is not supposed to be, comprising:

a first step of forming a mending phase shifter entirely on said mask substrate and setting the thickness of said mending phase shifter from said surface of said mask substrate as 2 ($\pm 1/8$) times as thick as said phase shifter, said mending phase shifter being made of material which has the same refractive index as that of said phase shifter;

a second step of forming a resist on said mending phase shifter at an area which corresponds to said black defect area; and a third step of etching said mending phase shifter through said resist leaving a permanently formed portion of said mending phase-shifter which phase shifts ($\pm 10°$) light passing therethrough at an integer multiple of 360° C.

4. The method of claim 3, wherein said phase shifter is made of an oxide silicon film and said mending phase shifter is made of SOG.

5. The method of claim 3, wherein said mending phase shifter is made of oxide silicon.

6. The method of claim 5, wherein said first step further comprises the steps of:

forming an oxide silicon film which has the same refractive index as that of said phase shifter entirely on said on said mask substrate in such a manner that said oxide silicon film is 2.5 or more times as thick as said phase shifter and has a flat surface; and etching said oxide silicon film from above so that a resultant oxide silicon film, which is a mending phase shifter, has a thickness 1.5 to 2.5 times as thick as said phase shifter.

7. The method of claim 3, further comprising the step of, before said first step, forming a thin film entirely on said mask substrate on which said phase shifter and said light shielding pattern are disposed, said thin film being etching-resistant so that it is not etched away during the etching of said third step.

8. The method of claim 3, wherein said mask substrate is entirely covered with a thin film which is not etched away by the etching of said third step so that a light beam through said thin film and said phase shifter is 180 degrees out of phase with a non-phase-shifted light beam.

9. A method of mending a black defect area in a mask which has a phase shift pattern which is comprised of a light shielding film of first pattern formed on a mask substrate and a phase shifter of a second pattern formed on uncovered surface of said mask substrate, said black defect area being made of said phase shifter and located in a surface of said mask substrate where it is not supposed to be, comprising:

a first step of forming a mending phase shifter entirely on said mask substrate which is made of material in such a manner that said mending phase shifter is 2 ($\pm 1/8$) times as thick as said phase shifter, said mending phase shifter being made of material which has the same refractive index as that of said phase shifter and has a flat surface;

a second step of forming a resist on said mending phase shifter at an area which corresponds to said black defect area; and a third step of etching said mending phase shifter through said resist leaving a permanently formed portion of said mending phase shifter which phase shifts ($\pm 10°$) light passing therethrough at an integer multiple of 360°.

10. A method of mending a white defect area in a mask which has a phase shifter formed on a mask substrate in the shape of a pattern, said white defect area being defined as a partially lacked portion of said phase shifter, comprising the steps of: permanently forming a mending phase shifter on and around-white-defect area which includes said white defect area to a thickness causing light passing therethrough to be phase shifted (±10°) by an integer multiple of 360° and eliminating an adverse optical effect of said white defect, said mending phase shifter being made of material which has the same refractive index as that of said phase shifter.

11. The method of claim 10, wherein said mending phase shifter is 1.5 to 2.5 times as thick as said phase shifter.

12. A method of mending a white defect area in a mask which has a phase shift pattern which is comprised of a phase shifter of a predetermined pattern formed on a mask substrate and a light shielding film of a predetermined pattern formed on said phase shifter, said white defect area being defined as a partially lacked portion of said phase shifter, comprising:

a first step of forming a mending phase shifter entirely on said mask substrate and setting the thickness of said mending phase shifter from said surface of said mask substrate as 3 (±1/18) times as thick as said phase shifter, said mending phase shifter being made of material which has the same refractive index as that of said phase shifter;

a second step of forming a resist on said mending phase shifter at an area which corresponds to said white defect area; and a third step of etching said mending phase shifter through said resist leaving a permanently formed portion of said mending phase shifter which phase shifts light passing therethrough at an integer multiple of 360° (±10°).

13. A method of mending white defect area in a mask which has a phase shift pattern which is comprised of a light shielding film of a predetermined pattern formed on a mask substrate and phase shifter of a predetermined pattern formed on an uncovered surface of said mask substrate, said white defect area being defined as a partially lacked portion of said phase shifter, comprising:

a first step of forming a mending phase shifter entirely on said mask substrate and setting the thickness of said mending phase shifter from said surface of said mask substrate as 3 (±1/18) times as thick as said phase shifter, said mending phase shifter being made of material which has the same refractive index as that of said phase shifter;

a second step of forming a resist on said mending phase shifter at an area which corresponds to said white defect area; and a third step of etching said mending phase shifter through said resist leaving a permanently formed portion of said mending phase shifter which phase shifts (±10°) light passing therethrough at an integer multiple of 360°.

* * * * *